(12) United States Patent
Narendrnath et al.

(10) Patent No.: US 11,569,069 B2
(45) Date of Patent: Jan. 31, 2023

(54) 3D PRINTED CHAMBER COMPONENTS CONFIGURED FOR LOWER FILM STRESS AND LOWER OPERATING TEMPERATURE

(71) Applicant: APPLIED MATERIALS, INC., Santa Clara, CA (US)

(72) Inventors: Kadthala R. Narendrnath, San Jose, CA (US); Govinda Raj, Bangalore (IN); Goichi Yoshidome, Emeryville, CA (US); Bopanna Ichettira Vasantha, Bangalore (IN); Umesh M. Kelkar, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/945,510

(22) Filed: Jul. 31, 2020

(65) Prior Publication Data

US 2020/0365374 A1  Nov. 19, 2020

Related U.S. Application Data

(63) Continuation of application No. 15/015,849, filed on Feb. 4, 2016, now Pat. No. 10,777,391.
(Continued)

(51) Int. Cl.
*H01J 37/32* (2006.01)
*B22F 10/20* (2021.01)
*B33Y 80/00* (2015.01)

(52) U.S. Cl.
CPC ..... *H01J 37/32477* (2013.01); *H01J 37/3211* (2013.01); *H01J 37/3288* (2013.01); *H01J 37/32467* (2013.01); *H01J 37/32807* (2013.01); *H01J 37/32853* (2013.01); *H01J 37/32871* (2013.01); *B22F 10/20* (2021.01);
(Continued)

(58) Field of Classification Search
None
See application file for complete search history.

(56) References Cited

U.S. PATENT DOCUMENTS 5,459,297 A  10/1995  Boppel et al.
5,614,071 A   3/1997  Mahvan et al.
(Continued)

FOREIGN PATENT DOCUMENTS

CN  1577732 A  2/2005
CN  1806316 A  7/2006
(Continued)

OTHER PUBLICATIONS

Office Action from European Patent Application No. 16746946.9 dated Dec. 19, 2020.
(Continued)

*Primary Examiner* — Jason Berman
(74) *Attorney, Agent, or Firm* — Moser Taboada

(57) ABSTRACT

A chamber component for a processing chamber is disclosed herein. In one embodiment, a chamber component for a processing chamber includes a component part body having unitary monolithic construction. The component part body has a textured surface. The textured surface includes a plurality of independent engineered macro features integrally formed with the component part body. The engineered macro features include a macro feature body extending from the textured surface.

14 Claims, 9 Drawing Sheets

Related U.S. Application Data

(60) Provisional application No. 62/184,144, filed on Jun. 24, 2015, provisional application No. 62/112,649, filed on Feb. 6, 2015.

(52) U.S. Cl.
CPC ........... *B22F 2999/00* (2013.01); *B33Y 80/00* (2014.12); *Y02P 10/25* (2015.11)

(56) References Cited

U.S. PATENT DOCUMENTS

| | | | |
|---|---|---|---|
| 5,837,057 A * | 11/1998 | Koyama | B41J 2/1631 118/723 VE |
| 6,162,297 A * | 12/2000 | Mintz | C23C 14/564 118/715 |
| 6,506,312 B1 | 1/2003 | Bottomfield | |
| 6,933,508 B2 | 8/2005 | Popiolkowski et al. | |
| 2004/0056211 A1 | 3/2004 | Popiolkowski et al. | |
| 2005/0001918 A1 | 1/2005 | Berezin et al. | |
| 2009/0237901 A1 | 9/2009 | Fjelstad | |
| 2012/0258280 A1 * | 10/2012 | Jackson | C23C 16/4404 428/156 |
| 2013/0029480 A1 | 1/2013 | Niklaus et al. | |
| 2015/0021628 A1 | 1/2015 | Medendorp, Jr. et al. | |

FOREIGN PATENT DOCUMENTS

| | | |
|---|---|---|
| CN | 1293596 C | 1/2007 |
| CN | 103430280 A | 12/2013 |
| EP | 2156914 A1 | 2/2010 |
| JP | 2001509214 A | 7/2001 |
| JP | 2002319520 A | 10/2002 |
| JP | 2005039279 A | 2/2005 |
| JP | 2007027707 A | 2/2007 |
| JP | 2013232642 A | 11/2013 |
| JP | 2014518590 A | 7/2014 |
| WO | WO 2005/001918 A1 | 1/2005 |

OTHER PUBLICATIONS https://web.archive.org/web/20131104005653/htt[p://www.tatasteeleurope.com/en/products_and_services/products/construction_products_and_systems/floors/durbar/, Tata Steel Europe Archive Nov. 4, 2013 (year 2013).
Office Action from Japanese Patent Application No. 2017-541314 dated Jan. 6, 2020.
Office Action from Chinese Patent Application 201680008925.8 dated Sep. 25, 2018.
Extended Search Report from EP 16746946.9 dated Sep. 5, 2018.
International Search Report and Written Opinion for PCT/US2016/013583 dated May 2, 2016 (8 pgs).

* cited by examiner

3D PRINTED CHAMBER COMPONENTS CONFIGURED FOR LOWER FILM STRESS AND LOWER OPERATING TEMPERATURE

CROSS-REFERENCE TO RELATED APPLICATIONS

This application is a continuation of U.S. patent application Ser. No. 15/015,849, filed Feb. 4, 2016, which claims benefit of U.S. Provisional Application Ser. No. 62/112,649, filed Feb. 6, 2015, and U.S. Provisional Application Ser. No. 62/184,114, filed Jun. 24, 2015, each of which are incorporated by reference in their entirely.

BACKGROUND OF THE INVENTION

Field of the Invention

Embodiments of the invention relate to chamber components for equipment used in the manufacturing of semiconductor devices

Description of the Related Art

Reliably producing sub-half micron and smaller features is one of the key technology challenges for next generation very large scale integration (VLSI) and ultra large-scale integration (ULSI) of semiconductor devices. However, as the limits of circuit technology are pushed, the shrinking dimensions of VLSI and ULSI interconnect technology have placed additional demands on processing capabilities. Reliable formation of gate structures on the substrate is important to VLSI and ULSI success and to the continued effort to increase circuit density and quality of individual substrates and die.

As the dimensions of the integrated circuit components are reduced (e.g., to deep sub-micron dimensions), the materials used to fabricate such components must be carefully selected in order to obtain satisfactory levels of electrical performance. For example, when the distance between adjacent metal interconnects and/or the thickness of the dielectric bulk insulating material that isolates interconnects having sub-micron dimensions, the potential for capacitive coupling occurs between the metal interconnects is high. Capacitive coupling between adjacent metal interconnects may cause cross talk and/or resistance-capacitance (RC) delay which degrades the overall performance of the integrated circuit and may render the circuit inoperable.

The manufacture of the sub-half micron and smaller features rely upon a variety of processing equipment, such as physical vapor deposition chambers (PVD) among others. The deposition chambers use RF coils to maintain a plasma in the processing chamber. Existing chamber components utilized in PVD chambers may have a high temperature differential which causes high film stress for materials that adheres to the components during the operation of the PVD chamber. The higher film stress may result in flaking of the deposited material during operation of the PVD chamber after the film has reached a critical thickness. The flaking of the deposited material results in increased of contamination (i.e., particles) of the interior of the PVD chamber which contributes to substrate defects and low yield. Thus, the high risk of contamination undesirably demands increased frequency for cleaning and maintenance of the PVD chamber.

Therefore, there is a need for improved chamber components that help prevent contamination of processing chambers.

SUMMARY

Disclosed are embodiments for engineered features formed as a part of a textured surface on chamber components.

In one embodiment, a chamber component for a processing chamber has a body. The body has unitary monolithic construction. The body has a textured surface. The textured surface has a plurality of independent engineered features wherein the engineered features include macro features. The engineered features are configured to reduce film stress and tune the thermal conductivity of the chamber component.

In another embodiment, a chamber component for a processing chamber includes a component part body having unitary monolithic construction. The component part body has a textured surface. The textured surface includes a plurality of independent engineered macro features integrally formed with the component part body. The engineered macro features include a macro feature body extending from the textured surface.

In yet another embodiment, a cup of a coil spacer for a processing chamber includes a body having unitary monolithic construction. The body includes an exterior surface, a top portion, a bottom portion, an opening disposed in the top portion and extending towards the bottom portion, an interior surface disposed adjacent the opening, an upper lip proximate the top portion and disposed between the exterior surface and the interior surface, and a plurality of macro-level surface features formed on the exterior surface.

In yet another embodiment, a cup of a coil spacer for a processing chamber includes a body having unitary monolithic construction formed by an additive fabrication technique. The additive manufacturing technique may be Selective laser sintering, binder jetting, Material Jetting, powder bed fusion, sheet lamination, direct energy deposition or any other additive manufacturing process. The body includes an exterior surface, a top portion, a bottom portion, an opening disposed in the top portion and extending towards the bottom portion, an interior surface disposed adjacent the opening, an upper lip proximate the top portion and disposed between the exterior surface and the interior surface, and a plurality of macro-level surface features formed on at least one of the interior surface and the exterior surface. The surface features include comprise a repetitive predetermined pattern of engineered surface structures.

BRIEF DESCRIPTION OF THE DRAWINGS

So that the manner in which the above recited features of the present invention can be understood in detail, a more particular description of the invention, briefly summarized above, can be had by reference to embodiments, some of which are illustrated in the appended drawings. It is to be noted, however, that the appended drawings illustrate only typical embodiments of this invention and are therefore not to be considered limiting of its scope, for the invention can admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

Figure 1A:
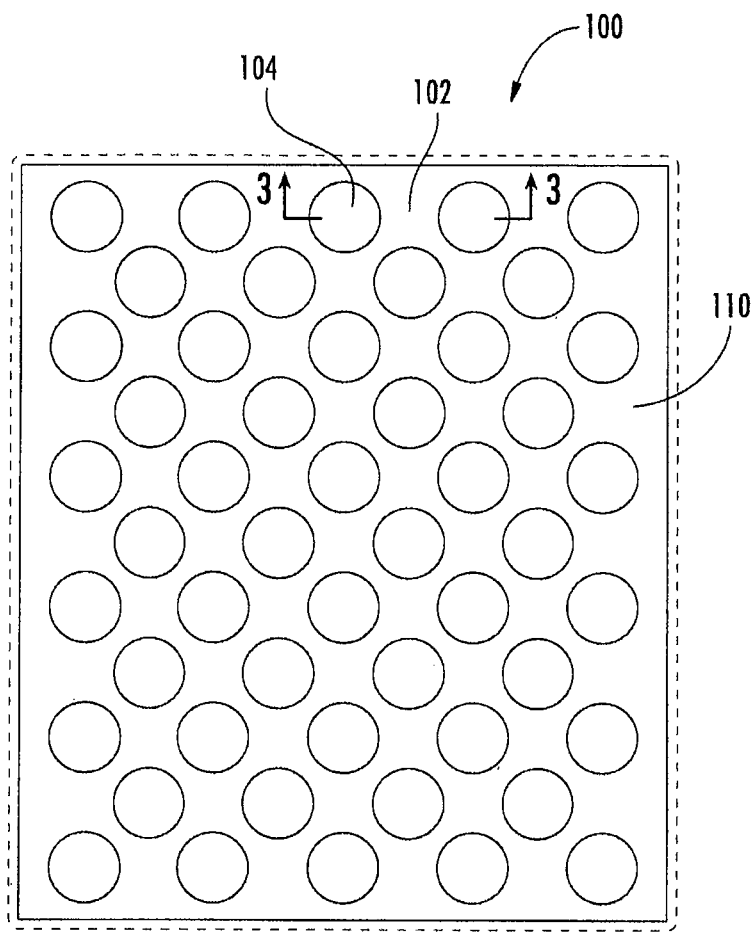
FIG. 1A is partial plan view of a textured surface of a processing chamber component.

It is to be noted, however, that the appended drawings illustrate only exemplary embodiments of this invention and are therefore not to be considered limiting of its scope, for the invention may admit to other equally effective embodiments.

DETAILED DESCRIPTION 3D printing is a technique of manufacturing three dimensional components by laying down successive thin layer of material. 3D Printing is also used in Semiconductor industry for manufacturing semiconductor processing chamber components (which include coil cups) for plasma deposition chambers that can provide improved adhesion of deposition material on the surface of the chamber component. In a 3D printing process, a thin layer of precursor, e.g., a powder or other feed stock material is progressively deposited and fused to form a full 3-dimensional component of the chamber. This additive manufacturing technique enables surfaces of the chamber component to be engineered to provide improved film adhesion, which inhibits flaking of the film from the chamber component where the flakes become a process contaminant. This additive manufacturing technique may additionally or alternatively enable surfaces of the chamber components to be engineered to minimize thermal temperature changes during processing across the surface of the component, which in turn results in a lower film stress for materials adhered to the surface of the chamber component. In some embodiments, a single step production may produce monolithic components which may be formed from one or more material layers. The material layers, may be optimize for providing localized strength, cost savings, heat transfer, optical reflectivity, or other beneficial properties. Although 3D printing is described as advantageously enabling the geometric form of the chamber component, it is contemplated that chamber components having similar geometry may be fabricated utilizing other manufacturing techniques.

As introduced above, some 3D printed chamber components may be designed to promote film adhesion and have lower temperature differentials across the component during operation of the processing chamber. For example, a coil cup used in a PVD chamber that has a lower temperature differential which will in turn help reduce film stress of material which may be inadvertently deposited on the coil cup during substrate deposition operations performed in the PVD chamber. The reduced film stress increases adhesion of the PVD films to the cup. The increased adhesion of the film to the cup resists flaking and thus, reduces contamination in the PVD chamber. Since the potential for contamination is reduced, the frequency for cleaning and maintaining the PVD chamber (also known as the mean time between cleaning (MTBC)) may be advantageously extended. Surfaces of the chamber components may have features that promote film adhesion to the cup. The adhesion features may include surface textures, such as knurled surfaces, increased roughness, dimples, grooves, protrusions or other adhesion enhancing surface features.

Implementations of the invention may include one or more of the following. A chamber component having an outer surface formed with engineered surface features that improve adhesion of deposition materials from the process chamber, and thus reducing the tendency of the deposited material to flake off over time. The engineered surface features are generally a repetitive pattern of recessed, projecting or mixed surface structures that interrupt the macro-level surface contour defining the shape of the feature. Additionally, the macro-level surface contour may have similar, albeit small in scale, micro-level surface features disposed thereon. The chamber component may be formed from a plurality of layers, wherein a thickness of each layer of the plurality of layers may be less than 66 μm (micrometers). Recesses and projections forming the features may optionally be formed in internal portions of the chamber component when desired.

In embodiments wherein the chamber component is fabricated using 3D printing, the chamber component printed material may solidify using a curing process. The chamber component may be formed from a material precursor which includes properties which demonstrate resistance to high temperatures. Abrasives or other particles may be supplied in the precursor material utilized to fabricate the chamber component which enhances texturing of the surface for the chamber component. Additionally, a plurality of printed precursor materials may be used in forming different portions of the chamber component. The chamber component precursor material may alternately be a melted material which is solidified by cooling. Alternately, the chamber component may be formed using a manufacturing technique separate from and texturing of the surface may be formed using a subsequent additive technique of manufacturing.

Advantages of the invention may include one or more of the following. A chamber component which can be manufactured within very tight tolerances, i.e., good thickness uniformity and control. Grooves and other geometric features may be formed in the chamber component in portions not accessible using traditional manufacturing methods. Additive manufacturing enables complex shapes and geometries that are difficult or impossible to replicate with traditional methods of manufacturing. Additionally, the 3D printed chamber component may be manufactured faster and cheaper than other similarly shaped conventional chamber component.

FIG. 1A is partial plan view of a textured surface 102 of a processing chamber component 100. The chamber component 100 may have a component part body 140 having unitary monolithic construction. The component part body 140 has a textured surface 102. Alternately, the chamber component 100 may be have the textured surface 102 added in a secondary operation. The textured surface 102 may be at least on the exterior surfaces of the component part body 140 that are exposed to the processing environment of the processing chamber, and thus subject to deposition thereon. The textured surface 102 may be a large scale (macro) texture which includes a repetitive predefined pattern of engineered features 104. The term "engineered features" means that the general shape and arrangement of the features defining the surface of the chamber component are formed utilizing an additive manufacture process, such as 3D printing or other precision fabrication technique, that produces a predefined geometric shape on the surface of the chamber component such that a predefined pattern of high tolerance structures is formed. The engineering features 104 may have a shape and arrangement of apertures formed while 3D printing the underlying body 140 of the chamber component 100. The engineered features 104 may have shapes or configurations only achievable via additive manufacturing. The engineered features 104 may be at least partially recessed below the textured surface 102 or above the textured surface 102. The engineered features 104 may also be substantially coplanar with the textured surface 102 of the chamber component 100. The engineered features 104 may be contiguously connected, or be discrete forms. The engineered features 104 are configured to reduce film stress and/or tune the thermal conductivity of the underlying camber component 100. The engineered features 104 may have a shape and form different from adjacent features 104. The engineered features 104 may additionally include micro features formed thereon. The micro features formed on engineered features 104 may be similarly constructed as the larger features, i.e., via an additive manufacturing technique. Optionally, the micro features may be formed using traditional roughening (e.g., non-engineered) techniques, such as bead blasting and the like. Alternately, the shape of each engineered feature is unique to its location and function and may be different from adjacent features.

Figure 1B:
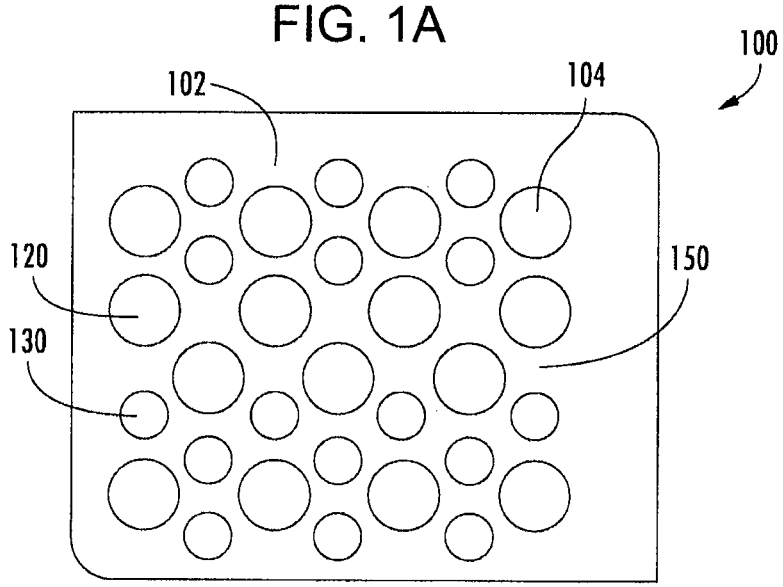
FIG. 1B is partial plan view of an alternative pattern for the textured surface of the processing chamber component.

The engineered features 104 formed as part of the textured surface 102 may be arranged in a repetitive pattern or in a random manner. For example, the engineer features may be arranged in a repetitive pattern of small toroids, chainmail, scales, ripples, egg-carton like texture, knurled diamond shapes, close-packed shapes, dimples, groves, protrusions, and sinusoidal wave-like profiles, among other patterns. In one embodiment the engineered features 104 are arranged to avoid creation of an uninterrupted planar surface extending between the engineered features 104, for example, by arranging the engineered features 104 in a pattern or other arrangement that prevents a line of sight surface from being formed between the engineered features 104 across the textured surface 102. Examples of engineered features 104 arranged in a pattern 150 that has no line of sight surface defined between the engineered features 104 across the textured surface 102 is depicted in FIG. 1B. The engineered features 104 may encompass a plurality of sizes and shapes. For example, the pattern of the engineered features 104 may have both larger features 120 and smaller features 130. In other embodiments, there may be additionally features 104 which may be larger or smaller then either the larger features 120 or the smaller features 130. In yet another embodiment, the features 104 may be similarly sized and arranged in a pattern, such as pattern 110 shown in FIG. 1A. Pattern 110 may be arranged such that there is no line of sight surface defined between the engineered features 104. Beneficially, a processing chamber component 100 having a textured surface 102 with no line of sight surfaces defined between the engineered features 104 forming the textured surface 102 eliminates long uninterrupted linear surfaces which are susceptible to peeling of deposited material and/or easily shed particles. Thus, processing chamber component 100 having a textured surface 102 with no line of sight surfaces defined between the engineered features 104 allow for longer service intervals between cleaning with diminished risk of deposited film flaking, thereby improving product yields, reduced maintenance requirements and more profitable operation of processing chambers in which the texturized processing chamber component 100 is utilized.

The ease in which engineered features 104 of a macro scale may be applied to the processing chamber component 100 allow a textured surface 102 to be formed on surfaces where traditional texturing either would not be possible or could potentially damage the chamber component. An additive manufacturing technique for fabricating the engineered features 104, allows the engineered features 104 to be formed with undercuts, cross holes, dimples and other surface contours in locations inaccessible to tooling, and thus creating structure geometry which could not be previously formed. Furthermore, the engineered features 104 and textured surface 102 can be formed on processing chamber components 100 fabricated from stainless steel, aluminum, ceramic or other materials.

As discussed above, the engineered features 104 may have any number of geometric shapes, and the shapes do not have to be uniform across the textured surface 102. Although the engineered features 104 are shown in plan view as circles the engineered features 104 may have complex shapes such as polygonal or irregular shapes, among others. Additionally, the spacing between the engineered features 104 distribution across the textured surface 102 may be uniform or irregular in shape and size.

Figure 2:
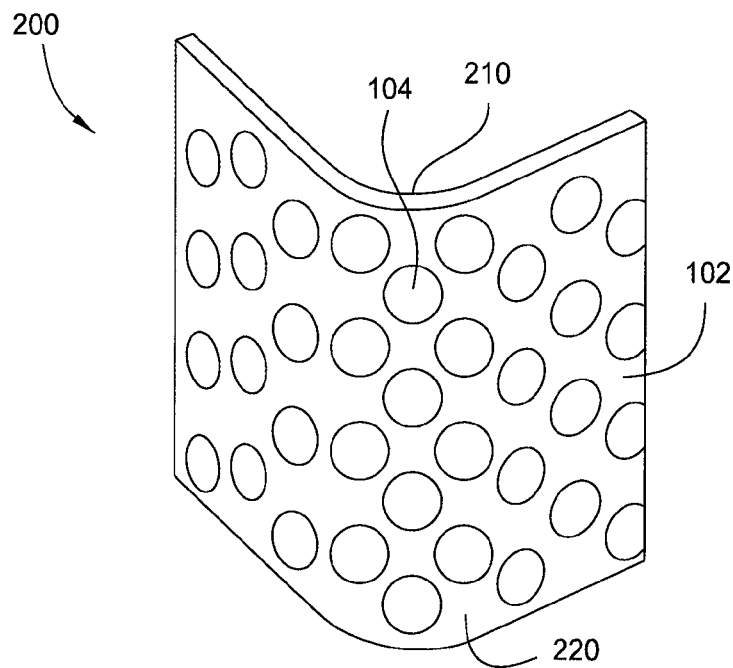
FIG. 2 is a partial isometric view for a textured curved surface of the processing chamber component.

Turning briefly to FIG. 2, the engineered features 104 may be formed on a curved surface without distortion of the engineered features 104. FIG. 2 illustrates a partial plan view of a textured curved surface of the chamber component 200. The chamber component 200 may be curved, cylindrical, have an arc, a bevel or other rounded surface. For example, the chamber component 200 may be a shield, liner pedestal, or other chamber component and may have an inner surface 210 and/or an outer surface 220. The inner surface 210 and the outer surface 220 may be textured with the engineered features 104 to reduce film stress and promote adhesion of deposition materials. Forming the engineered features 104 through additive manufacturing techniques allows the engineered features 104 at or near a curve 202 on either inner surface 210 or the outer surface 220 of the chamber component 200 to have consistency in the layer thickness. Additionally, the shape and size of the engineered feature 104 may not be distorted by the curve 202, particularly for example when the curve 202 is formed on an inside corner. Thus, the engineered features 104 can provide uniform anchor points for deposited material to stick on.

Figure 3:
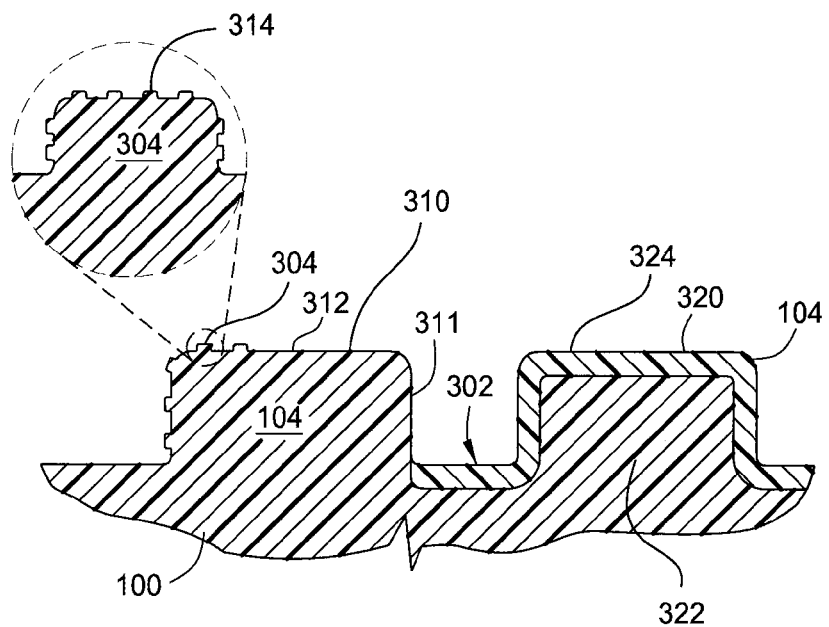
FIG. 3 is a partial cross-sectional view for features of the textured surface of the processing chamber component of FIG. 6 taken through section line 8-3.

Example implementations of engineered features 104 are further described with references to FIG. 3 and FIGS. 4A-4F and FIGS. 5A-5B. FIG. 3 is a partial cross-sectional view of engineered features of the textured surface of the processing chamber component of FIG. 1 taken through section line 3-3 of FIG. 1. FIGS. 4A-4F are partial plan views for example engineered features 104 for the textured surface 102 of the processing chamber component. FIG. 5 is a partial plan view for additional example engineered features for the textured surface of the processing chamber component. It should be appreciated that the engineered features 104 illustrated in FIGS. 4A-4F and FIGS. 5A-5B are merely representative and the engineered features 104 may have materials, shapes and sizes among other attributes suitable for promoting a desired property such as film adhesion and/or thermal conductivity.

FIG. 3 shows two adjacent features 104 identified as a macro level engineered feature 310 and a second macro level engineered feature 320. The two macro level engineered features 310, 320 are but two engineered features 104 in the plurality of engineered features 104 disposed on the chamber component 100. The two macro level engineered features 310, 320 may have structural differences such as those shown in the examples of FIGS. 4A-4F and FIGS. 5A-5B. The macro level engineered feature 310 may be substantially similar to the second macro level engineered feature 320. Alternately, the two macro level features 310, 320 may be different. For example, the macro level engineered feature 310 may be similar to engineered feature 410 in FIG. 4A while the second macro level engineered feature may be similar to engineered feature 430 shown in FIG. 4D.

The engineered features 104, formed as part of the chamber component 100, may have a repetitive predetermined pattern of recesses, projections or mixed recesses and projections that creates an engineered surface structure (as opposed to random peaks and valleys of micro-level roughness created by surface blasting) that interrupts the macro-level surface contour to promote film adhesion of deposited materials.

The second macro level engineered feature 320 is shown having an optional outer layer 324. The optional outer layer 324 may or may not exist on all the engineered features 104 as well and is merely shown here on the second macro level feature 320 for simplicity of discussion. The optional outer layer 324 may have additionally layers from a base material 322 to the outer surface 332. For example, the base material 322 may be a suitable material chosen with attention to cost, heat transfer or other desirable properties. The optional outer layer 324 may have one or more layers stack to form the optional outer layer 324. The stack of layers may be arranged to promote adhesion and changes from a property of the base material 322 to the outer surface 332. For example, the base material 322 may be a stainless steel material and the outer surface 332 may be formed from a ceramic material wherein the outer layer 324 blends a transition between the two materials.

The arrangements of the engineered features 104 across discrete areas of the chamber components may provide variations in the localized properties of the chamber components. For instance, the various engineered features 104 shown in FIGS. 4A-4F and FIGS. 5A-5B may be used to tune thermal conductivity, film stress, and other properties in various areas of the processing environment of the processing chamber to promote uniformity and reduce environmental contamination. The engineered features 104 may also be randomly arranged across the surfaces of the chamber component 100 in some embodiments. The engineered features 104 may provide a macro-textured area which promotes a desired property such as adhesion of deposition materials. For example, the engineered features 104 may have macro level features 310.

In some embodiments, micro level features 304 may be formed on the outer surface 332 of the macro level features 310. In some embodiments, the micro level feature 304 may reside on a surface 302 between the macro level features 310, 320. In yet other embodiments, there may be no additionally engineered features formed on the engineered macro level feature 310. The micro level features 304 may be substantially similar to the macro level features 310. Alternately, the micro level features 304 may differ in shape than the nearest macro level feature 104. For example, the micro level features 304 may be an engineered feature and have structures such as those shown in the examples of FIGS. 4A-4F and FIGS. 5A-5B. The micro level features 304 may be formed as part of the engineered features 104. The micro level features 304 may be in a pattern, formed wholly across or just partially on the outer surface 332. For example, the micro level features 304 may be present on a top surface 312 but not a side surface 311 of the engineered feature 104. In other embodiments, the micro features may not be engineered features and be formed using traditional roughening techniques, such as bead blasting and the like.

Smaller sub-features 314 may optionally be formed on one or more of the micro features 304. In some embodiments, the sub-features 314 are formed directly on the micro features 304 or the surface between adjacent micro features 304. The sub-features 314 may be substantially similar to the macro features 104 or micro features 304. Alternately, the sub-features 314 may differ in shape or size from the nearest macro or micro feature 104, 304. In one embodiment, the sub-features 314 may have structures such as those shown in the examples of FIGS. 4A-4F and FIGS. 5A-5B. The sub-features 314 may be an engineered feature, or optionally the sub-features 314 may be formed using traditional roughening techniques, such as bead blasting and the like. Additionally, it is contemplated that additional features even smaller may be formed on the sub-features 314 as well.

The engineered features 104, such as the macro feature 310 optionally with additional micro features 204 and/or sub-features 314, may be configured to increase the surface area of the chamber component 100, 200. The increased surface area helps increase the film adhesion during processing. Thus, the engineered features 104 promote adhesion and mitigate flaking off of the adhered material and possibly contaminating the processing chamber. The engineered features 104 may also be configured to alter the thermal conductivity of the chamber component 100, 200.

Figure 4:
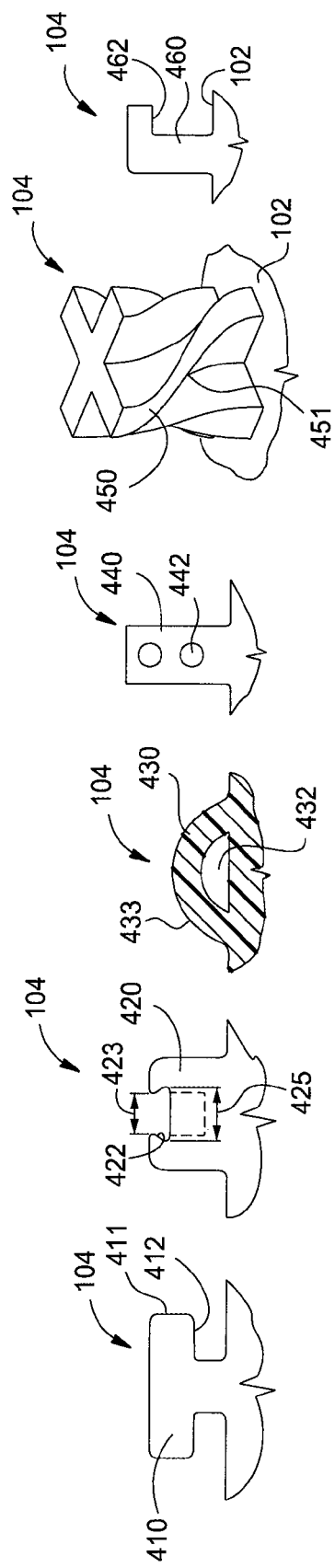
FIGS. 4A-4F are partial plan views for example features for the textured surface of the processing chamber component.
Figure 5:
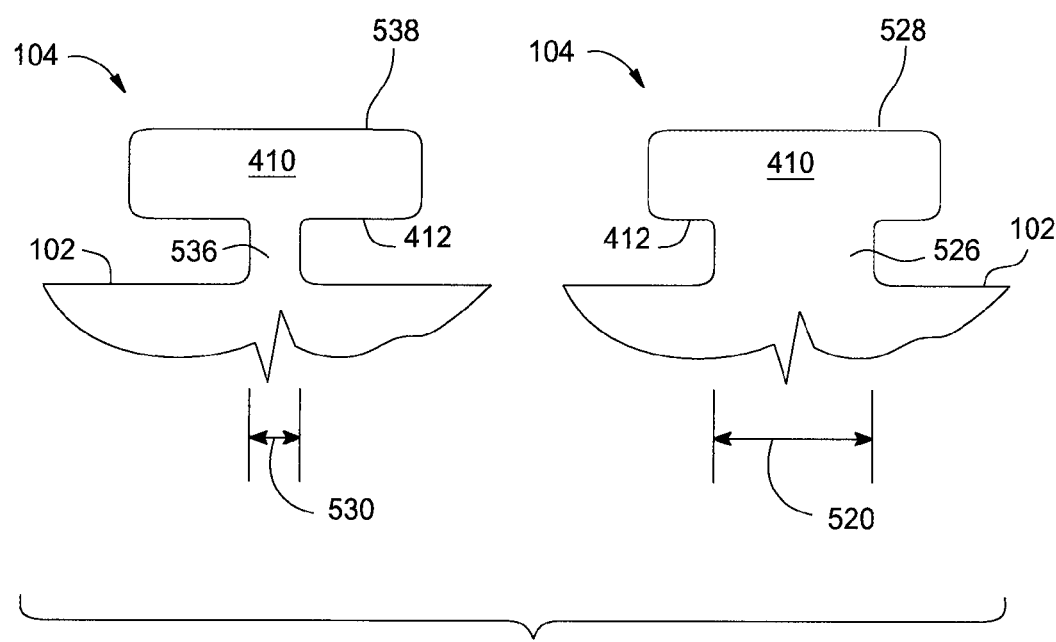
FIG. 5 is a partial plan view for additional example features for the textured surface of the processing chamber component.

FIGS. 4A-4F and FIGS. 5A-5B illustrate example engineered features 104 suitable for the macro, micro and smaller features 310, 304, 314. In one embodiment, an engineered feature 410, as shown in FIG. 4A, may have an undercut 412 on an outer edge 411 of the engineered features 410. The undercut 412 advantageously provides a secure anchor point for promoting strong film adhesion. The undercut 412 may advantageously be tuned to provide a thermal conductance for insulating some chamber components while minimizing temperature changes across other chamber components. For example, the undercut 412 may be made larger or smaller to tune the heat transfer between the film and chamber component. Turning briefly to FIGS. 5A and 5B, the engineered feature 410 has a larger undercut 412 in FIG. 5A than the FIG. 5B. The larger undercut 412 in FIG. 5A, results in a stem 536 having a smaller diameter 530 which attaches an upper portion 538 to the textured surface 102. The smaller diameter 530 of the stem 536 limits the heat transfer from the upper portion 538 to the textured surface 102, and as such, the stem 536 functions as a thermal choke which limits the heat transfer between the engineered feature 410 and component part body 140. Likewise, the smaller undercut 412 in FIG. 5B results in a stem 526 having a larger diameter 520 which attaches an upper portion 528 to the textured surface 102. The larger diameter 520 of the stem 526 promotes heat transfer from the upper portion 538 to the textured surface 102. Advantageously, the heat transfer may be tuned by adjusting the size of the undercut 412 for the engineered feature 410.

In another embodiment, the engineered features 104 may include an engineered feature 420 which has an undercut 422 disposed on an interior surface of the engineered feature 420, as shown in FIG. 4B. The undercut 422 may have an opening 423 which is narrower that the interior wall 425. Advantageously, the undercut 422 may provide a secure anchor point for deposition films that is not easily damaged when handling the chamber component. In another embodiment, the engineered features 104 may vary its shape from circular to triangle, square or polygon. It can form a three dimensional (3D) dimple or projection structure and also have trenches along the perimeter.

In yet another embodiment, the engineered features 104 may include a engineered feature 430 having an interior void 432, such as shown in FIG. 4C. The interior void 432 may have an upper surface 433 which completely encases the interior void 432 to minimize thermal conductance while additionally minimizing film adhesion. In some embodiments, the upper surface 433 provides a small vent (not shown) for venting the interior void 432. Alternately, the upper surface 433 may partially cover or bridge the interior void 432. In other embodiments, the upper surface 433 spans the void 432 and provides two or more openings. Advantageously, thermal conductance can be tuned while the interior void 432 of the engineered feature 430 provides an anchor for strong film adhesion. The interior void 432 may optionally be filled with a material having a coefficient of thermal expansion different than that of the material of the upper surface 433.

In yet another embodiment, the engineered features 104 may include an engineered feature 440 which has holes 442 as shown in FIG. 4D. The engineered feature 440 may have a round, rectangular or of any suitable cross-section for tuning the mass of material for conducting heat down to the textured surface 102. The holes 442 may be through holes or blind holes. The holes 442 may be oriented in a direction parallel with the textured surface 102, or at another angle. Advantageously, the holes 442 may reduce the thermal mass of the engineered feature 440 while providing multiple anchor points for deposited films to promote strong adhesion of the film. The holes 442 may alternatively be in the form of dimples, grooves, or slots, among other shapes formed into the engineered feature 440.

In yet another embodiment, the engineered features 104 may include a twisting or helical feature 450 attached to the textured surface 102 as shown in FIG. 4E. The helical feature 450 may be formed with holes, such as the holes 442 shown in FIG. 4D, or without holes. The helical feature 450 has surfaces 451 which face the textured surface 102 while being covered by the helical feature 450. In this manner, the surfaces 451 may promote film adhesion over exposed surfaces 452. Advantageously, the helical feature 450 may provide a large thermal mass while still providing anchor points for deposited films to promote strong adhesion of the film.

In yet another embodiment, the engineered features 104 may include a hook feature 460 as shown in FIG. 4F. The hook feature 460 may be round, rectangular or of any suitable cross-section to tune the mass of material configured for conducting heat to the textured surface 102. The hook feature 460 may be formed with holes, such as the holes 442 shown in FIG. 4D, or without holes. The hook feature 460 has a surface 462 which faces the textured surface 102 while being covered by a body 462 of the hook feature 460. In this manner, the surfaces 462 may promote film adhesion. Advantageously, the hook feature 460 may provide a tunable thermal mass while providing anchor points for deposited films to promote strong adhesion of the film.

It should be appreciated that the shapes described for the engineered features 104 with respect to FIGS. 4A-4F and 5A-5B are merely a sample of exemplary shapes, and other shapes and combination of shapes for the engineered features 104 are contemplated. For example, the engineered feature 410 of FIG. 4A may have the outer edge 411 with a second undercut or stacked ribbed effect which further increases the surface area for promoting adhesion.

Figure 6:
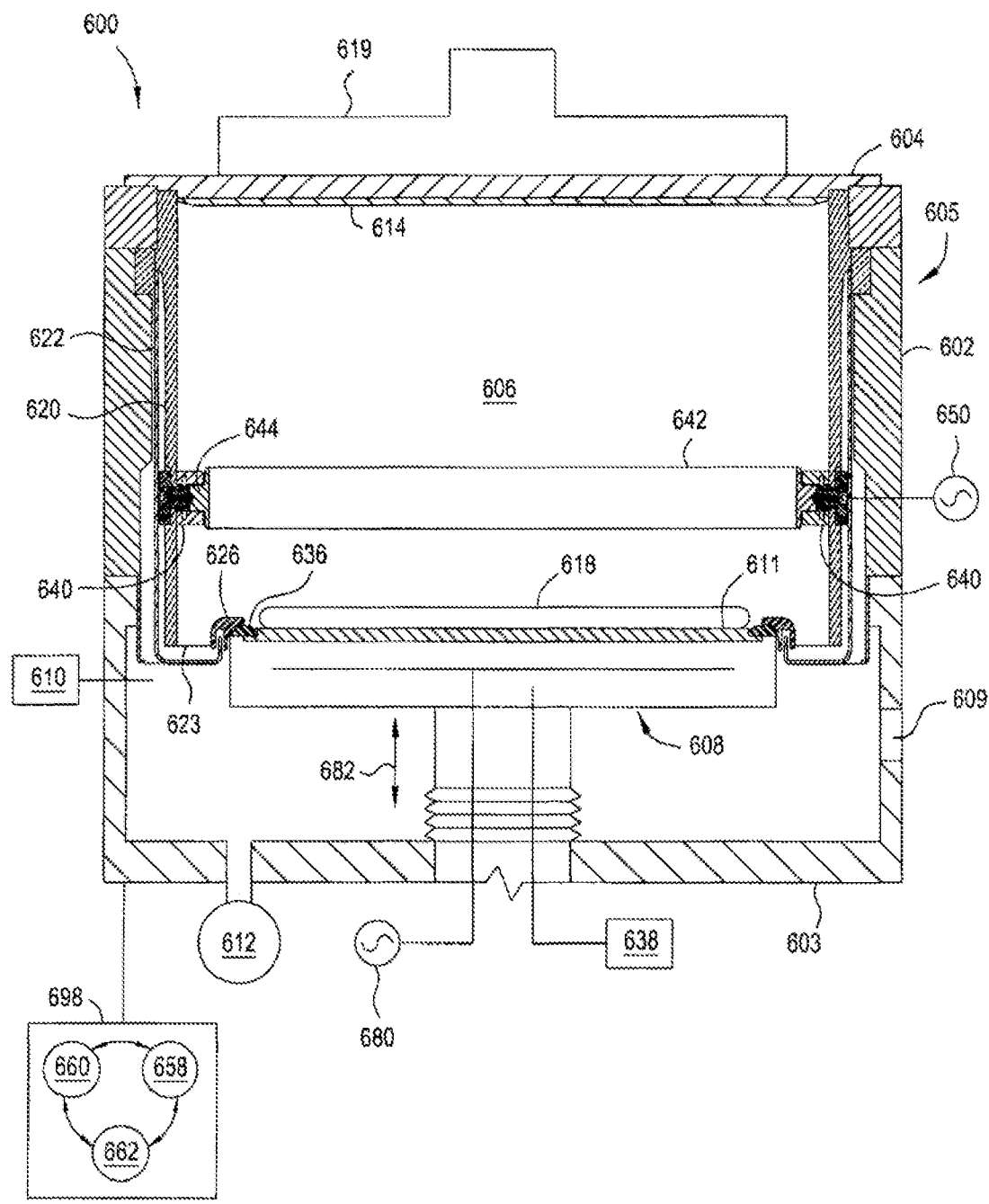
FIG. 6 depicts a schematic cross-sectional view of one embodiment of a process chamber having components suitable for the textured surface.

Referring now to FIG. 6, FIG. 6 illustrates an exemplary physical vapor deposition (PVD) processing chamber 600 having components suitable for the textured surface 102 and having engineered surface engineered features 104. Examples of suitable PVD chambers include the SIP ENCORE® PVD processing chambers, commercially available from Applied Materials, Inc., Santa Clara, of Calif. It is contemplated that processing chambers available from other manufactures may also be adapted to perform the embodiments described herein. In one embodiment, the processing chamber 600 is capable of depositing, for example, titanium, aluminum oxide, aluminum, aluminum nitride, copper, tantalum, tantalum nitride, titanium nitride, tungsten, or tungsten nitride on a substrate 618.

The processing chamber 600 having an inductive coil 642, according to one embodiment. The processing chamber 600 has a body 605 that includes sidewalls 602, a bottom 603, and a lid 604 that encloses an interior volume 606. A substrate support, such as a pedestal 608, is disposed in the interior volume 606 of the processing chamber 600. A substrate transfer port 609 is formed in the sidewalls 602 for transferring substrates into and out of the interior volume 606.

A gas source 610 is coupled to the processing chamber 600 to supply process gases into the interior volume 606. In one embodiment, process gases may include inert gases, non-reactive gases, and reactive gases, if necessary. Examples of process gases that may be provided by the gas source 610 include, but not limited to, argon gas (Ar), helium (He), neon gas (Ne), nitrogen gas ($N_2$), oxygen gas ($O_2$), and $H_2O$ among others.

A pumping device 612 is coupled to the processing chamber 600 in communication with the interior volume 606 to control the pressure of the interior volume 606. In one embodiment, the pressure of the processing chamber 600 may be maintained at about 1 Torr or less. In another embodiment, the pressure within the processing chamber 600 may be maintained at about 500 milliTorr or less. In yet another embodiment, the pressure within the processing chamber 600 may be maintained at about 1 milliTorr and about 300 milliTorr.

The lid 604 may support a sputtering source, such as a target 614. The target 614 generally provides a source of material which will be deposited in the substrate 618. The target 614 may be fabricated from a material containing titanium (Ti) metal, tantalum metal (Ta), tungsten (W) metal, cobalt (Co), nickel (Ni), copper (Cu), aluminum (Al), alloys thereof, combinations thereof, or the like. In an exemplary embodiment depicted herein, the target 614 may be fabricated by titanium (Ti) metal, tantalum metal (Ta) or aluminum (Al).

The target 614 may be coupled to a DC source power assembly 616. A magnetron 619 may be coupled adjacent to the target 614. Examples of the magnetron 619 assembly include an electromagnetic linear magnetron, a serpentine magnetron, a spiral magnetron, a double-digitated magnetron, a rectangularized spiral magnetron, among others. Alternately, powerful magnets may be placed adjacent to the target 614. The magnets may rare earth magnets such as neodymium or other suitable materials for creating a strong magnetic field. The magnetron 619 may confine the plasma as well as distributing the concentration of plasma along the target 614.

A controller 698 is coupled to the processing chamber 600. The controller 698 includes a central processing unit (CPU) 660, a memory 658, and support circuits 662. The controller 698 is utilized to control the process sequence, regulating the gas flows from the gas source 610 into the processing chamber 600 and controlling ion bombardment of the target 614. The CPU 660 may be of any form of a general purpose computer processor that can be used in an industrial setting. The software routines can be stored in the memory 658, such as random access memory, read only memory, floppy or hard disk drive, or other form of digital storage. The support circuits 662 are conventionally coupled to the CPU 660 and may comprise cache, clock circuits, input/output subsystems, power supplies, and the like. The software routines, when executed by the CPU 660, transform the CPU 660 into a specific purpose computer (controller) 698 that controls the processing chamber 600 such that the processes are performed in accordance with the present invention. The software routines may also be stored and/or executed by a second controller (not shown) that is located remotely from the processing chamber 600.

An additional RF power source 680 may also coupled to the processing chamber 600 through the pedestal 608 to provide a bias power between the target 614 and the pedestal 608, as needed. In one embodiment, the RF power source 680 may provide power to the pedestal 608 to bias the substrate 618 at a frequency between about 1 MHz and about 100 MHz, such as about 13.56 MHz.

The pedestal 608 may be movable between a raised position and a lowered position, as shown by arrow 682. In the lowered position, a top surface 611 of the pedestal 608 may be aligned with or just below the substrate transport port 609 to facilitate entry and removal of the substrate 618 from the processing chamber 600. The top surface 611 may have an edge deposition ring 636 sized to receive the substrate 618 thereon while protecting the pedestal 608 from plasma and deposited material. The pedestal 608 may be moved to the raised position closer to the target 614 for processing the substrate 618 in the processing chamber 600. A cover ring 626 may engage the edge deposition ring 636 when the pedestal 608 is in the raised position. The cover ring 626 may prevent deposition material from bridging between the substrate 618 and the pedestal 608. When the pedestal 608 is in the lowered position, the cover ring 626 is suspended above the pedestal 608 and substrate 618 positioned thereon to allow for substrate transfer.

During substrate transfer, a robot blade (not shown) having the substrate 618 thereon is extended through the substrate transfer port 609. Lift pins (not shown) extend through the top surface 611 of the pedestal 608 to lift the substrate 618 from the top surface 611 of the pedestal 608, thus allowing space for the robot blade to pass between the substrate 618 and pedestal 608. The robot may then carry the substrate 618 out of the processing chamber 600 through the substrate transport port 609. Raising and lowering of the pedestal 608 and/or the lift pins may be controlled by the controller 698.

During sputter deposition, the temperature of the substrate 618 may be controlled by utilizing a thermal controller 638 disposed in the pedestal 608. The substrate 618 may be heated to a desired temperature for processing. After processing, the substrate 618 may be rapidly cooled utilizing the thermal controller 638 disposed in the pedestal 608. The thermal controller 638 controls the temperature of the substrate 618, and may be utilized to change the temperature of the substrate 618 from a first temperature to a second temperature in a matter of seconds to about a minute.

An inner shield 620 may be positioned in the interior volume 606 between the target 614 and the pedestal 608. The inner shield 620 may be formed of aluminum or stainless steel among other materials. In one embodiment, the inner shield 620 is formed from stainless steel. An outer shield 622 may be formed between the inner shield 620 and the sidewall 602. The outer shield 622 may be formed from aluminum or stainless steel among other materials. The outer shield 622 may extend past the inner shield 620 and is configured to support the cover ring 626 when the pedestal 608 is in the lowered position.

In one embodiment, the inner shield 620 includes a radial flange 623 that includes an inner diameter that is greater than an outer diameter of the inner shield 620. The radial flange 623 extends from the inner shield 620 at an angle greater than about ninety degrees (90°) relative to the inside diameter surface of the inner shield 620. The radial flange 623 may be a circular ridge extending from the surface of the inner shield 620 and is generally adapted to mate with a recess formed in the cover ring 626 disposed on the pedestal 608. The recessed may be a circular groove formed in the cover ring 626 which centers the cover ring 626 with respect to the longitudinal axis of the pedestal 608.

The inductive coil 642 of the processing chamber 600 may having one turn. The inductive coil 642 may be just inside the inner shield 620 and positioned above the pedestal 608. The inductive coil 642 may be positioned nearer to the pedestal 608 than the target 614. The inductive coil 642 may be formed from a material similar in composition to the target 614, such as tantalum, to act as a secondary sputtering target. The inductive coil 642 is supported from the inner shield 620 by a plurality of coil spacers 640. The coil spacers 640 may electrically isolated the inductive coil 642 from the inner shield 620 and other chamber components.

The inductive coil 642 may be coupled to a power source 650. The power source 650 may have electrical leads which penetrate the sidewall 602 of the processing chamber 600, the outer shield 622, the inner shield 620 and the coil spacers 640. The electrical leads connect to a tab 644 on the inductive coil 642 for providing power to the inductive coil 642. The tab 644 may have a plurality of insulated electrical connections for providing power to the inductive coil 642. Additionally, the tabs 644 may be configured to interface with the coil spacers 640 and support the inductive coil 642. The power source 650 applies current to the inductive coil 642 to induce an RF field within the processing chamber 600 and couple power to the plasma for increasing the plasma density, i.e., concentration of reactive ions.

Figure 7:
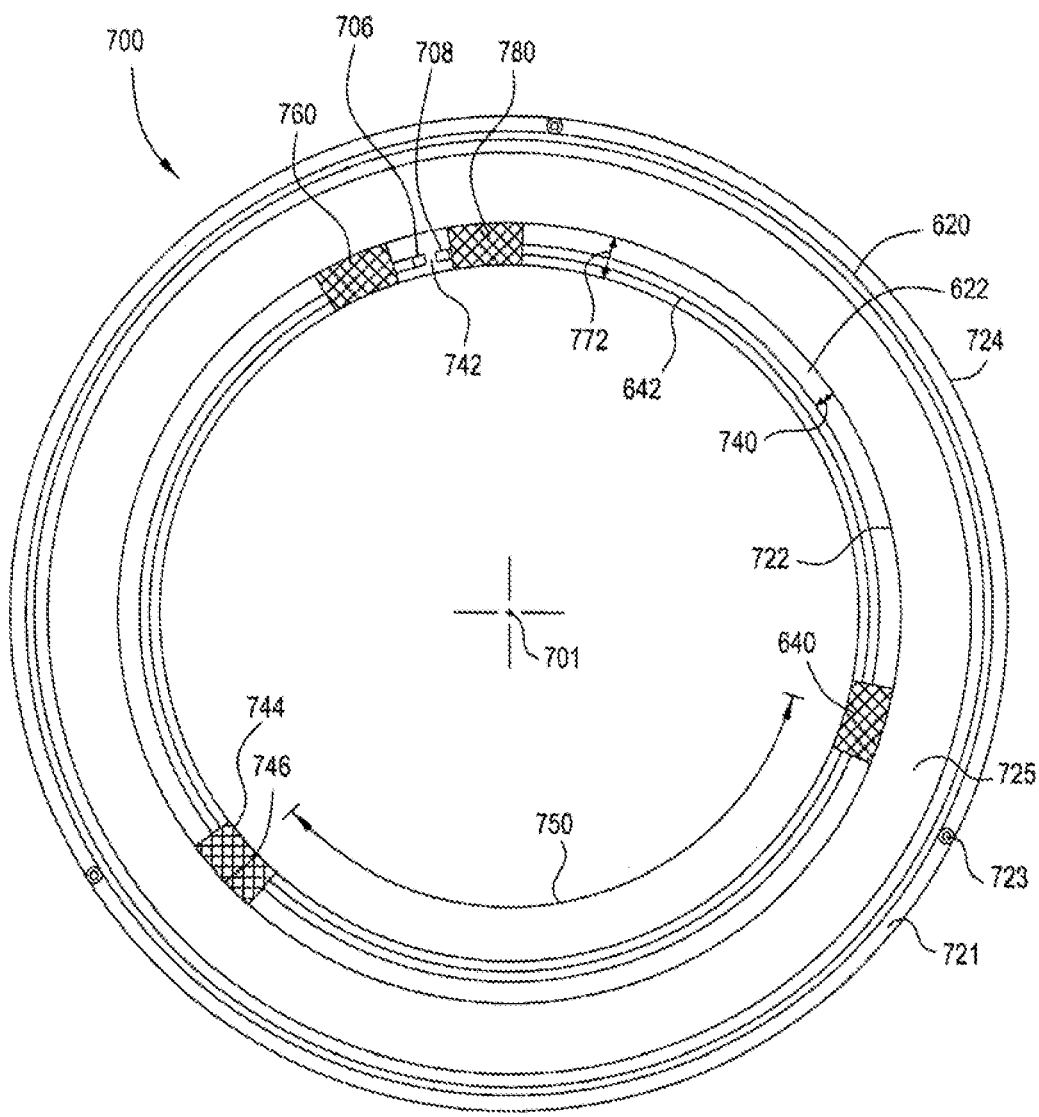
FIG. 7 depicts a process kit for the processing chamber illustrated in FIG. 11 having a coil spacer.

FIG. 7 depicts a schematic top-view diagram for a process kit 700 for the processing chamber 600 shown in FIG. 6 having the coil spacer 640. The process kit 700 includes the inner shield 620, the outer shield 622 and the inductive coil 642. The process kit 700 may additionally, or alternately, include a deposition ring, a cover ring, a shadow ring, a focus ring, a shadow frame and the like. The process kit 700 has a central axis 701 about which the inner shield 620, the outer shield 622 and the inductive coil 642 are centered. The inner shield 620 has a top surface 725, an inner surface 722 and an outer surface 724 all of which may have engineered surface engineered features 104.

Referring additionally to FIG. 6, the inner surface 722 of the inner shield 620 is exposed to the interior volume 606 of the processing chamber 600. The outer surface 724 is disposed adjacent to the sidewall 602 and the outer shield 622. The top surface 611 is disposed adjacent to the lid 604 of the processing chamber 600. The inner shield 620 has a plurality of fasteners 723 along a lower top surface 721 for attaching the inner shield 620 to the outer shield 622.

The outer shield 622 is disposed along the outer surface 724 and extends under the inner shield 620. The outer shield 622 has an inner diameter 772 which extends beyond the inner surface 722 of the inner shield 620. The inner diameter 772 is closer to the central axis 701 than the inner surface 722. In one embodiment, the inner surface 722 is closer to the central axis 701 than the inductive coil 642.

The inductive coil 642 is spaced apart from the inner surface 722 of the inner shield 620 by a distance 740 by the coil spacer 640. The coil spacer 640 has a top 744 and a bottom 746. The distance 740 is determined by how far apart the top 744 is from the bottom 746 the coil spacer 640. That is, the height of the coil spacer 640 determines the distance 740. The distance 740 may be tuned for optimizing plasma density and prevent the energized inductive coil 642 from arcing.

The coil spacers 640 may be circumferentially spaced about the central axis 701. For example, each of the plurality of the coil spacers 640 may be spaced apart by a spacing 750. The equidistant spacing 750 of adjacent coil spacers 640 provides a uniformly support the inductive coil 642.

The inductive coil 642 may have a first end 708 and a second end 706. The inductive coil 642 may have a single turn such that a gap 742 is formed between the ends 706, 708. The ends 706, 708 of the inductive coil 642 may be supported. In one example, a first coil spacer 780 of the plurality of coil spacers 640 may be interfaced with the inductive coil 642 proximate the first end 708 and a second coil spacer 760 of the plurality of coil spacers 640 may be interfaced with the inductive coil 642 proximate the second end 706 to provide support to the inductive coil near the gap 742. Alternately, the coil spacer 640 may span the gap 742 to interface with both ends 706, 708 of the inductive coil 642 physically without electrically bridging the ends 706, 708. In this manner, one coil spacer 640 may support both the first end 708 and the second end 706.

As discussed above, the inductive coil 642 may be supported by a plurality of coil spacers 640. For example, the inductive coil 642 may have three or more coil spacers 640 for supporting the inductive coil 642. In one embodiment, the first coil spacer 780 of the plurality of coil spacers 640 may have an electrical connector for providing power to inductive coil 642. In one embodiment, the second coil spacer 760 of the plurality of coil spacers 640 may have an electrical return path for coupling the inductive coil 642 to ground. Alternately, the first coil spacer 780 may provide both power and return paths through the first coil spacer 780 to the inductive coil 642.

Figure 8:
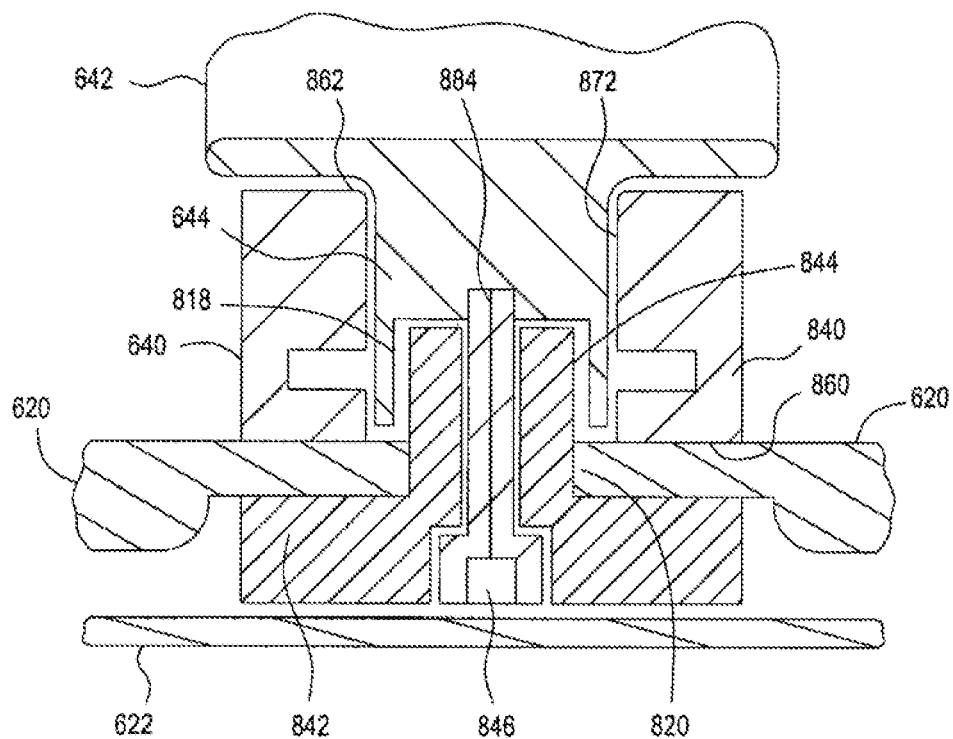
FIG. 8 depicts a cross-sectional view of the coil spacer illustrated in FIG. 7.

An exemplary example of a chamber component 100, 200 having surface engineered features 104 will now be described relative to the coil spacer 640. FIG. 8 depicts a cross-sectional view of the coil spacer 640 illustrated in FIG. 7. The coil spacer 640 may include a cup 840. In one embodiment, the coil spacer 640 comprises only the cup 840. The coil spacer 640 may optionally include at least one tab receptor 842. A fastener 846 may be utilized to hold the tab receptor 842 and cup 840 together to forming the coil spacer 640. In yet another embodiment, the tab receptor 842 and the fastener 846 may be integrated into a single piece in the assembly of the coil spacer 640.

The cup 840 has a top portion 862 and a bottom portion 860. The bottom portion 860 may be disposed proximate the inner surface 722 of the inner shield 620. The cup 840, tab receptor 842 and fastener 846 may attach together to secure the coil spacer 640 to the inner shield 620. In one embodiment, the bottom portion 860 of the cup 840 is disposed proximate an opening 820 on the inner surface 722 of the inner shield 620. In another embodiment, the bottom portion 860 of the cup 840 is disposed proximate the inner surface 722 of the inner shield 620. For example, the opening 820 may have one of the cup 840, tab receptor 842 or fastener 846 extending therethrough. In another embodiment, the inner shield 620 may have a feature (not shown) which inter-fits with a complimentary feature of the cup 840 to located and/or secure the coil spacer 640 to the inner shield 620. For example, the coil spacer 640 may have threads, ferrule, taper or other structure suitable for attaching the coil spacer 640 to the inner shield 620. Alternately, the bottom portion 860 may be adhered to the inner surface 722, such as with an epoxy or other adhesive.

The tab receptor 842 may serve as a backing or structural member for attaching the cup 840 to the inner shield 620. Additionally, the tab receptor 842 or fastener 846 may interface with the tab 644 of the inductive coil 642. The tab receptor 842 may have receiving features 844 for forming a joint or connection with respective complimentary tab features 818 on the tab 644. In one embodiment, the features 844, 818 engage to form a structural connection between the tab 644 and the coil spacer 640 for supporting the inductive coil 642. The features 844, 818 may be fingers joints, tapered joint, or other suitable structure for forming a union between tab 644 and the coil spacer 640 suitable for supporting the inductive coil 642. In some embodiments, the features 844, 816 may form part of the aforementioned electrical connection.

One or more of the coil spacers 640 (such as the first coil spacer 780 of the plurality of coil spacers 640 shown in FIG. 7) may have an electrical pathway 884 extending therethrough. The electrical pathway 884 may provide an electrical connection between the tab 644 on the inductive coil 642 and the power source 650 for energizing the inductive coil 642. Alternately, the coil spacers 640 may not provide an electrical pathway and the power for energizing the inductive coil 642 is provided in another manner without passing through one of the coil spacers 640. The electrical pathway 884 may be a conductive path for transmitting an electrical signal. Alternately, the electrical pathway 884 may be a void or space which provides accessibility of electrical connections between the power source 650 and the tab 644 of the inductive coil 642.

The cup 840 may be formed of a thermally insulating material, such as a ceramic. Additionally, or alternately, the cup 840 may be formed of an electrically insulating material. Alternately still, the cup 840 may be formed from a metal, such as stainless steel. The cup 840 may electrically isolate the inductive coil 642 from the inner shield 620. The cup 840 may have an opening 872. The opening 872 may be configured to accept the tab 644. The opening 872 may disposed in the top portion 862 and extend towards the bottom portion 860. In one embodiment, the opening 872 has a circular profile and is configured to accept a round tab 644. In another embodiment, the opening 872 is shaped to receive a tab 644 having a complimentary inter-fitting shape.

Figure 9:
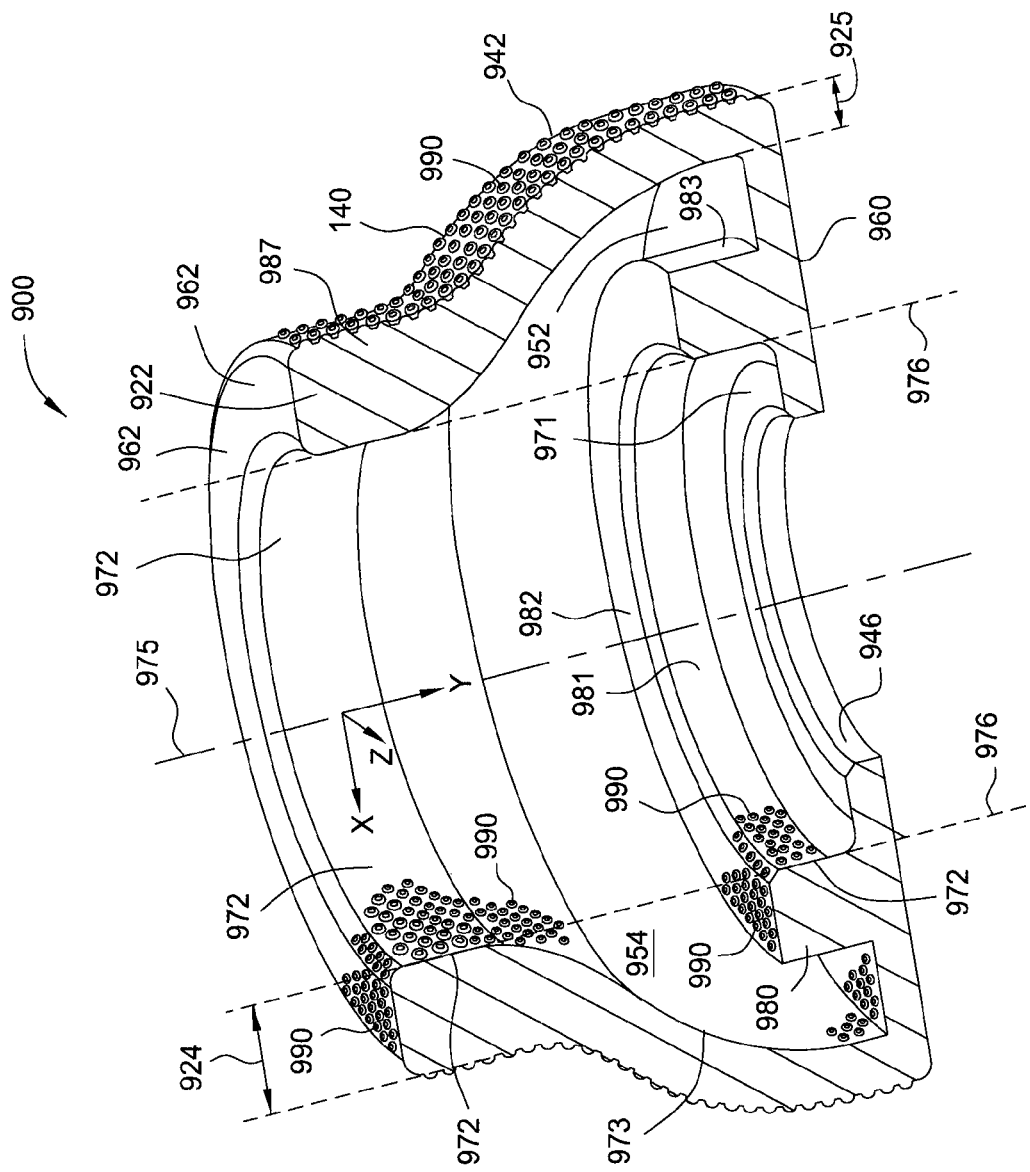
FIG. 9 depicts a cross-sectional view a cup in accordance with one embodiment.
Figure 10:
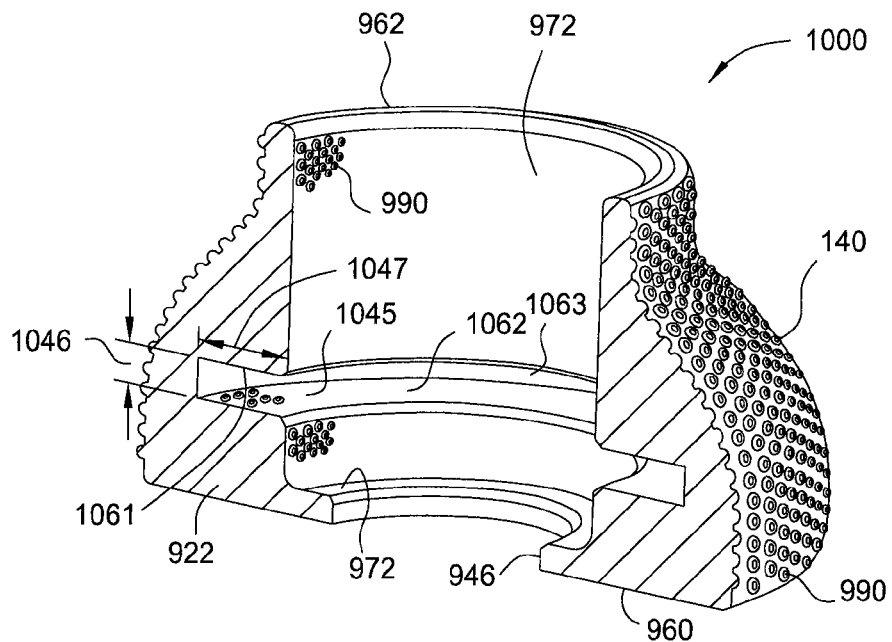
FIG. 10 depicts a cross-sectional view of a cup in accordance with another embodiment.
Figure 11:
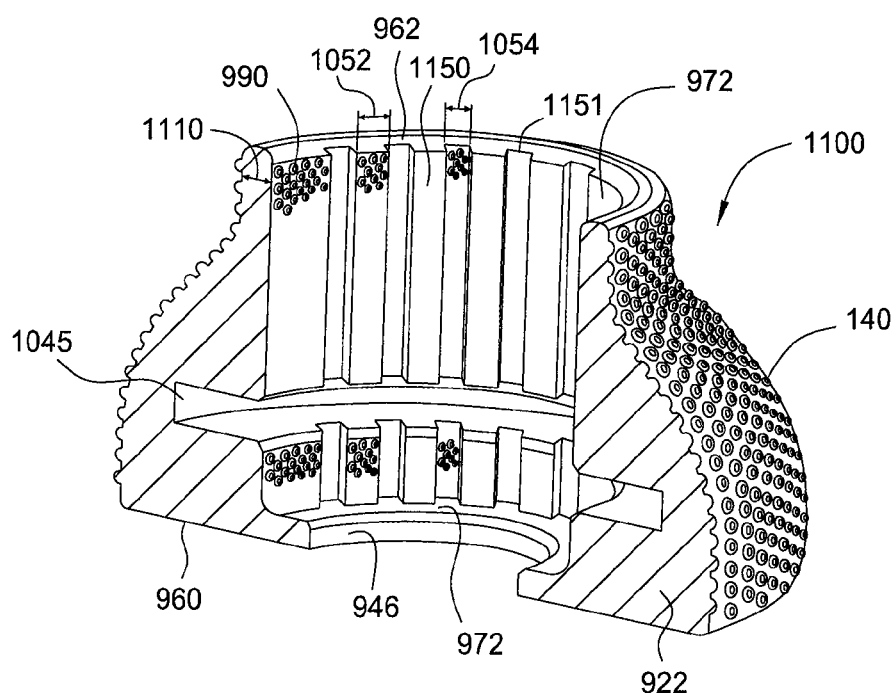
FIG. 11 depicts a cross-sectional view of a cup in accordance with yet another embodiment.

The cup 840 of the coil spacer 640 may have surfaces configured to promote adhesion and minimize flaking of deposited material during operation of the processing chamber 600. FIGS. 9 through 11 illustrate various arrangements for a cup of a coil spacer 640 which are configured to inhibit flaking of deposited material. FIG. 9 depicts a cross-sectional view of one embodiment of a cup 840 illustrated as a cup 900. FIG. 10 depicts a cross-sectional view of one embodiment of a cup 840 illustrated as a cup 1000. FIG. 11 depicts a cross-sectional view of yet another embodiment of a cup 840 illustrated as a cup 1100.

In some embodiments, the coil spacers 640 may be formed using an additive manufacturing method, such as 3D printing. The cups 840, 900, 1000, 1100 of the coil spacers 640 may be fabricated using a 3D printing process that forms the cups 840, 900, 1000, 1100 from sequential deposition of material, for example, in multiple layers that are fused into a singular monolithic structure. Suitable techniques for 3D printing the cups 840, 900, 1000, 1100 may generally include directed energy deposition, powder bed fusion, or sheet lamination among other techniques. For example, a polyjet 3D technique is a layer additive technology with layers as thin as 16 microns (0.0006"). The polyjet rapid prototyping process uses high resolution ink-jet technology combined with UV curable materials to create highly detailed and accurate layers or surface finishes in the cups 840, 900, 1000, 1100. In another example, the 3D printer uses fused deposition modeling (FDM) to additively lay material down in layers. A filament or wire of the coil cup material is unwound from a coil and fused together to produce the cups 840, 900, 1000, 1100. In yet another example, the 3D printer inkjets a binder into a powder bed. This technique is known as "binder jetting" or "drop-on-powder". The powder bed may contain additives as well as base materials for producing features and characteristics in the cups 840, 900, 1000, 1100. The inkjet print head moves across a bed of powder, selectively depositing a liquid binding material. A thin layer of powder is spread across the completed section and the process is repeated with each layer adhering to the last. In another example, the cups 840, 900, 1000, 1100 may be 3D printed using selective laser sintering. A laser or other suitable power source sinters powdered material by aiming the laser automatically at points in the powder defined by a 3D model. The laser binds the material together to create a solid monolithic structure. When a layer is finished, the build platform moves downward and a new layer of material is sintered to form the next cross section (or layer) of the cups 840, 900, 1000, 1100. Repeating this process builds up the cups 840, 900, 1000, 1100 one layer at a time. Selective laser melting (SLM) uses a comparable concept, but in SLM the material is fully melted rather than sintered allowing for different crystal structure, porosity, among other properties. In another example, the cups 840, 900, 1000, 1100 are generated using sheet lamination. The cups 840, 900, 1000, 1100 may be manufactured by layering sheets of material on top of one-another and binding them together. The 3D printer then slices an outline of the cup 840, 900, 1000, 1100 into the bound sheets of material. Repeating this process builds up the cups 840, 900, 1000, 1100 one layer (sheet) at a time to form a monolithic structure. In yet another example, the cups 840, 900, 1000, 1100 are generated using directed energy deposition (DEP). DEP is an additive manufacturing process in which focused thermal energy is used to fuse materials by melting them. The material may be fed into a molten pool created by an electron beam which is then guided by a computer to move about to form a layer of the cups 840, 900, 1000, 1100 on a build platform to form a monolithic structure. It should be appreciated that example techniques are suitable for 3D printing the cups 840, 900, 1000, 1100 as are other 3D printing techniques.

It should be appreciated that additives may be incorporated into the base material for generating surface textures or other features in the coil spacers 640. For example, additives may be used to create porosity in the surfaces of the cups 840, 900, 1000, 1100 for better adhesion of materials deposited during plasma processing. The additives may or may not have a homogenous concentration in the base material throughout the cups 840, 900, 1000, 1100. The additives may gradually change in concentration in different areas of the cups 840, 900, 1000, 1100. For example, the additives may gradually decrease or increase in concentration across the cups 840, 900, 1000, 1100 in an edge to center relationship. Thus, the additives may have a larger concentration at or near the final surfaces of the cups 840, 900, 1000, 1100.

Pores or surface features may be formed on the surfaces of the cups 840, 900, 1000, 1100 using additives such as inkjet bubbles, foamed UV curable features, reactive jetting or other techniques for creating pores. Porosity of the cups 840, 900, 1000, 1100 can be achieved in the final cured material by rapid mixing of the viscous formulation, followed immediately by UV curing to trap the air bubbles in place. Alternatively, small bubbles of an inert gas (such as nitrogen) can be used as an additive and introduced to the formulation, mixed and immediately cured. Pores can also be achieved by adding porogens such as polyethylene glycol (PEG), polyethylene oxide (PEO), hollow particles, or microspheres, of about 5 nm-50 µm in diameter, e.g., gelatin, chitosan, $Si_3N_4$, polymethylmethacrylate (PMMA), mesoporous nanoparticles, carboxyl methyl cellulose (CMC), macroporous hydrogels and emulsion microspheres. Alternatively, a leeching technique can be employed by the combination of a salt particulate (NaCl) and PEG as co-porogens wherein the salt is subsequently leeched out to form the pores.

Porosity can also be achieved by adding a UV activated species that generates gas & foaming (for example, with the help of a photoacid generator), e.g., the additional of a thermal initiator like 2,2'-Azobisisobutyronitrile (AIBN). Upon exposure to UV, the exothermic reaction of crosslinking causes the UV curable formulation to heat up which activates the AIBN, this also generates $N_2$ gas which is trapped during the curing process, leaving behind pores. Alternately, a UV curable polyurethane-acrylate (PUA) may have hollow nanoparticles for generating micropores.

The cups 900, 1000, 1100 have a body 922. The body 922 may be of unitary construction, such as that from 3D printing, and have an interior surface 972 and an exterior surface 942. The interior surface 972 is disposed adjacent the opening 872. The interior surface 972 and exterior surface 942 may be spaced apart to form an outer lip 962 at the top portion 862 the cups 900, 1000, 1100. The outer lip 962 may be configured to rigidly support the inductive coil 642 with minimal stress. The outer lip 962 may be sized to promote heat dissipation. For example, a larger, i.e., thicker, outer lip 962 has more mass and dissipates heat better than a thinner lip. The outer lip 962 may have a thickness 924 between about 2 mm and about 8 mm, such as about 5 mm, for better thermal performance. Although the cups 900, 1000, 1100 may operate in the processing chamber under similar conditions and at similar temperatures, the maximum operating temperature of each cup 900, 1000, 1100 is influenced properties and geometry of the cup 900, 1000, 1100, such as shape and thickness of the outer lip 962. The cup of one embodiment may have maximum temperatures exceeding that of the cups from other embodiments when used in the same processes chamber under the same temperature process.

The cups 900, 1000, 1100 may have substantially the same surface area on the exterior surface 942. For example, the exterior surface 942 may have a surface area of between about 9.000 square inches (in$^2$) to about 9.500 in$^2$. In one embodiment, the cups 900, 1000, 1100 have a surface area on the exterior surface of about 4.2388 in$^2$. It should be appreciated other parameters such as volume and weight may be substantially different for the cups 900, 1000, 1100 and will be discussed individually with each embodiment of the cups 900, 1000, 1100 below.

Although the cups 900, 1000, 1100 are shown symmetrical about a centerline 975, the cups 900, 1000, 1100 may be irregular in shape or asymmetrical. The opening 876 of the cups 900, 1000, 1100 extend through the top portion 862 of the cups 900, 1000, 1100. In one embodiment, the opening 876 may be described by a cylindrical projection (only shown by dashed lines 976 in FIG. 9) about the centerline 975. The opening 876 extends through the cups 900, 1000, 1100 to an inner lip 971. The inner lip 971 extends toward the centerline 975 to a bottom opening 946 in the cups 900, 1000, 1100. The bottom opening 946 may be configured to interface with the inner shield 620 of the processing chamber 600. The bottom opening 946 may also be configured to provide electrical or other connections between the processing chamber 600 and the inductive coil 642. For example, the inductive coil 642 may have power leads which pass through the bottom opening 946 to the RF power source 650 for energizing the inductive coil 642.

The exterior surface 942 may have surface features 990 formed thereon that promote adhesion to the cups 900, 1000, 1100. Similarly, the interior surface 972 may have surface features 990 formed thereon. The features 990 formed on the surfaces 972, 942 may be substantially similar. The surface features 990 formed on the surface 972, 942 may be repetitive predetermined pattern of recesses, projections or mixed recesses and projections that creates an engineered surface structure (as opposed to random peaks and valleys of micro-level roughness created by surface blasting) that interrupts the macro-level surface contour of the surface 972, 942 to promote film adhesion of deposited materials. Alternately, the geometry of the surface features 990 may differ on different the surfaces 972, 942 and/or across one or more of the surfaces 972, 942. The surface features 990 may be formed in localized patterns such that the pattern of surface features 990 may be different on any surface 972, 942. The surface features 990 may also have an irregular pattern or shapes such that the similarity of the surface features 990 across the surfaces 972, 942 is not discernible. The surface features 990 may provide a macro-textured area which promotes adhesion of deposition materials. During plasma processing, deposition materials may readily adhere to the surface features 990 formed on the exterior surface 942. The deposition materials may readily adhere to the surface features 990 formed on the interior surface 972 of the cup 900 as well. The surface features 990 may additionally be configured to increase the surface area of the cups 900, 1000, 1100. The increased surface area helps increase the film adhesion during processing. Thus, the features 990 promote adhesion and mitigate flaking off of the adhered material and possibly contaminating the processing chamber.

The surface features 990 may be voids such as that created by pores formed during the 3D printing process. The surface features 990 may be a texture such as a pattern of small toroids, chainmail, scales, ripples, egg-carton like, or other suitable textures for enhancing film adhesion. The features 990 may also include knurled diamond shapes, close-packed shapes, dimples, groves, protrusions, sinusoidal wave-like profile or other suitable macro level texture creating structure for increasing the surface area of the cups 900, 1000, 1100. The surface features 990 may be printed on the top portion 862 of the cups 900, 1000, 1100 as well. The top portion 862 may have a surface profile, such as a sinusoidal wave like profile, for increasing the surface area and promoting adhesion.

Turning to FIG. 9, the cup 900 has a void 954 extending beyond the opening 872. The opening 872 at the top portion 862 of the cup 900 extends downward to an inner lip 971 as shown by dashed lines 976. The interior void 954 extends from the dashed lines 976 to a lower portion 973 of the interior surface 972. The void 954 is bounded by a bottom surface 952 cup 900 which extends from a protrusion 980 proximate the inner lip 971 to the lower portion 973 of the interior surface 972. The protrusion 980 has a top surface 982, an inner surface 981 and an outer surface 983. The outer surface 983 is proximate the bottom surface 952. The inner surface 981 may be significantly aligned with the interior surface 972 such that inner surfaces 972, 981 are aligned with the cylindrical projection illustrated by dashed lines 976. The top surface 982, inner surface 981 and outer surface 983 may have surface features 990 formed thereon to promote adhesion of deposited films.

The body 922 of the cup 900 has a wall 987. The wall 987 has a thickness defined by the distance between the interior surface 972 and the exterior surface 942 of the wall 987. In one embodiment, the thickness of the wall 987 is substantially uniform. That is, a thickness 924 of the outer lip 962 is substantially the same throughout the profile of the wall 987 of the cup 900. In another embodiment, the wall 987 has a thickness which is not uniform. For example, the thickness 924 of the outer lip 962 may be greater than a thickness 925 at the bottom portion 860 of the wall 987.

In one embodiment, the body 922 of the cup 900 may be formed from stainless steel or other suitable material. The cup 900 may be configured to promote thermal uniformity and thus reduce stress in material adhered to the cup 900, which desirably mitigates flaking of the adhered material. The thermal mass and heat dissipating properties of the cup 900 may reduce the thermal gradients between the top portion 862 and the bottom portion 860 of the cup 900.

Turning to FIG. 10, the cup 1000 has a cavity 1045 extending beyond the opening 872. The cavity 1045 may have top surface 1061, a bottom surface 1062 and an inner wall 1063. The top surface 1061 and the bottom surface 1062 may have a depth 1047 defined by the distance of the surfaces 1061, 1062 from the inner wall 1063 to the opening 872. The inner wall 1063 may have a height 1046 defined by the distance between the top surface 1061 and the bottom surface 1062. The top and bottom surface 1061, 1062 along with the inner wall 1063 substantially describe the extent of the cavity 1045. In one embodiment, the cavity 1045 has a substantially rectangular side profile. In another embodiment, the cavity 1045 may have a triangular side profile wherein the top surface 1061 and the bottom surface 1062 intersect and there is no inner wall 1063. In yet another embodiment, the cavity 1045 may have a substantially trapezoidal side profile wherein the depth of the top surface 1061 is not the same as the depth of the bottom surface 1062. It should be appreciated the shape and size of the cavity 1045 may be selected to effect the thermal mass and heat dissipating features of the cup 1000.

The body 922 of the cup 1000 may be formed from stainless steel or other suitable material. The cup 1000 may be formed by additive manufacturing with surface features 990 formed thereon to promote adhesion of deposited material.

Turning to FIG. 11, the cup 1100 has fins 1150. Troughs 1151 are defined between the fins 1150. The fins 1150 may have a width 1052 which may be tuned to achieve a desired rate of heat transfer. The troughs 1151 may have a width 1054 determined by the number of fins 1150 and the width 1052 of the fins. In one embodiment, the cup 1100 may have 8 equally spaced fins 1150. Alternately, the cup 1100 may have between about 4 and 18 equally spaced fins 1150, such as 12 fins or 8 fins. The cups 1100 may additionally have a flange wall thickness 1110 near the inductive coil 642 of between about 2 mm to about 8 mm, such as about 5 mm. The fins 1150 and flange wall thickness 1110 help reduce the temperature differential across the cup 1100. The fins 1150 for the cup 1100 conduct heat away faster, thereby allowing the cup 1100 to be maintained at lower temperature compared to the finless cup 1000. The width 1052 of the fins 1150 plays a role in reducing the temperature of the cup 1100. For example, a cup having 8 fins 1150 having the width 1052 of about 2 mm may have temperature slightly higher than a cup having 8 fins 1150 having the width 1052 of about 3 mm. Thus, increasing the width 1052 of the fins 1150 may reduce the temperature experienced by the cup 1100 during operation of the processing chamber.

The cup 1100 may be formed by printed, such as 3D printing, from a stainless steel or other suitable material. The stainless steel material for the cup 1100 permits the cup 1100 to experience temperatures well in excess of the maximum temperature the cup 1100 experiences during operation. The cup 1100 may have two or more fasteners to hold the cup 1100 in place on the inner shield. The number of fasteners may be increased to improve thermal conductivity between the cup 1100 and inner shield.

In one embodiment, the cup 1100 has 8 fins and a flange wall thickness 1110 of about 5 mm. The cup 1100 may be formed by additive manufacturing with the features 990 formed on the surfaces, including the fins 1150 and troughs 1151, to promote adhesion of deposited material. The cup 1100 may be configured to promote thermal uniformity and thus reduce stress and mitigate flaking of adhered material. The thermal mass and heat dissipating features of the cup 1100 may reduce the thermal gradient between the top portion 862 and the bottom portion 860 of the cup 1100.

In yet another embodiment, the cup 1100 has 12 fins and a flange wall thickness 1110 of about 2 mm. In another embodiment, the cup 1100 has 12 fins and a flange wall thickness 1110 of about 5 mm. In yet another embodiment, the cup 1100 has 12 fins and a flange wall thickness 1110 of about 7 mm.

Advantageously, 3D printing of the chamber components, such as the cups for the coil spacer 640, readily allows the addition of surface features 990 which promote adhesion of deposition materials, i.e., films, on the chamber component. 3D printing of the chamber component also enables the formation of internal features, such as voids 954, cavities 1045, and fins 1150 shown in the cup 840 which promote lower operating temperatures and results in lower temperature gradients within the cup 840. The lower temperature gradient reduces the film stress in the deposited material and reduces the occurrence of film flaking. Thus, the features on the chamber components promote a reduction in particles being introduced into the processing environment from film flaking and a reduction in the frequency or mean time between cleaning and maintenance of the processing chamber.

While the foregoing is directed to embodiments of the present invention, other and further embodiments of the invention can be devised without departing from the basic scope thereof, and the scope thereof is determined by the claims that follow.

What is claimed is:

1. A chamber component for a processing chamber, the chamber component comprising:
a component part body having a unitary monolithic construction, the component part body having a textured surface, the textured surface comprising:
engineered macro features arranged in a repetitive pattern in multiple dimensions, wherein the engineered macro features extend outward from a base surface, the engineered macro features comprising multiple layers that are fused together and integrally formed with the component part body, wherein sidewalls of the engineered macro features extend substantially perpendicular from the base surface, and wherein the engineered macro features are arranged in a pattern that prevents a line of sight from being formed between the engineered macro features across the textured surface.

2. The chamber component of claim 1, wherein the engineered macro features are contiguously connected.

3. The chamber component of claim 1, wherein the engineered macro features are discrete independent features.

4. The chamber component of claim 1, wherein the component part body comprises a cover ring, a chamber liner, a shield, or coil spacer.

5. The chamber component of claim 1, wherein the engineered macro features define diamond shapes.

6. The chamber component of claim 1, wherein the engineered macro features define polygonal shapes.

7. The chamber component of claim 1, wherein the component part body is curved.

8. The chamber component of claim 1, wherein each layer of the multiple layers has a thickness of less than 66 micrometers.

9. The chamber component of claim 1, wherein the engineered macro features are uniform across the textured surface.

10. A cover ring for a processing chamber, the cover ring, comprising:
an annular body having a unitary monolithic construction, the body comprising:
an exterior surface; and
a plurality of macro-level surface features formed outwards on the exterior surface, wherein the plurality of macro-level surface features have sidewalls that extend substantially perpendicular to the exterior surface, wherein the plurality of macro-level surface features are contiguously connected, and wherein the plurality of macro-level surface features are formed on a curved surface of the annular body with substantially no distortion in size between features.

11. The cover ring of claim 10, wherein the annular body includes a recess disposed on a lower surface of the annular body and configured to center the cover ring with respect to a component of the processing chamber.

12. The cover ring of claim 10, wherein the plurality of macro-level surface features are uniformly distributed across the exterior surface.

13. The cover ring of claim 10, wherein the plurality of macro-level surface features comprise a repetitive predetermined pattern of engineered surface structures.

14. The cover ring of claim 10, wherein the plurality of macro-level surface features have rounded edges.

* * * * *